(12) United States Patent
Nakamura et al.

(10) Patent No.: US 6,497,477 B1
(45) Date of Patent: Dec. 24, 2002

(54) INK-JET HEAD MOUNTED WITH A DRIVER IC, METHOD FOR MANUFACTURING THEREOF AND INK-JET PRINTER HAVING THE SAME

(75) Inventors: Tetsuroh Nakamura, Hyogo; Hideaki Horio, Fukuoka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/433,697

(22) Filed: Nov. 3, 1999

(30) Foreign Application Priority Data

Nov. 4, 1998 (JP) .......................................... 10-312785
Jun. 10, 1999 (JP) .......................................... 11-163637

(51) Int. Cl.$^7$ .............................................. B41J 2/045
(52) U.S. Cl. ...................................................... 347/70
(58) Field of Search .............................. 347/70, 68, 54, 347/20

(56) References Cited

U.S. PATENT DOCUMENTS 4,686,538 A * 8/1987 Kouzato ....................... 347/15
5,359,351 A * 10/1994 Sato et al. ................... 346/209
6,037,957 A * 3/2000 Grande et al. .............. 347/147
6,071,427 A * 6/2000 Raulinaitis .................... 216/27
6,123,410 A * 9/2000 Beerling et al. .............. 347/42

FOREIGN PATENT DOCUMENTS

| JP | 05318735 A | 12/1993 | ............. B41J/2/05 |
| JP | 08174826 A | 7/1996 | ............ B41J/2/045 |
| JP | 9-226115 | 9/1997 | |
| JP | 9-323414 | 12/1997 | |
| JP | 9-323415 | 12/1997 | |
| JP | 10-100401 | 4/1998 | |

* cited by examiner

Primary Examiner—John Barlow
Assistant Examiner—K. Feggins
(74) Attorney, Agent, or Firm—Harness, Dickey & Pierce, P.L.C.

(57) ABSTRACT

Formed on a first face of a head main body are nozzles. Formed on an opposite second face of the head main body are actuators. A driver IC is, at its both ends, fixedly supported on the second face of the head main body so that the driver IC lies astride the actuators, in other words, the driver IC is mounted on a side of the head main body opposite to the ink emitting side. One ends of relay terminals formed on the second side of the head main body are coupled via respective wires to a printer main body. The other ends of the relay terminals are coupled via bonding wires to corresponding input terminals of the driver IC. Output terminals of the driver IC and input terminals of the actuators are connected together by bonding wires.

9 Claims, 11 Drawing Sheets

INK-JET HEAD MOUNTED WITH A DRIVER IC, METHOD FOR MANUFACTURING THEREOF AND INK-JET PRINTER HAVING THE SAME

FIELD OF THE INVENTION

The present invention relates to ink-jet heads.

BACKGROUND OF THE INVENTION

In the art, there are known ink-jet heads capable of recording by making utilization of the piezoelectric effect of piezoelectric elements. For example, such a type of ink-jet head is disclosed in Japanese Unexamined Patent Gazette No. H05-18735. This ink-jet head includes a head main body, wherein an actuator having a piezoelectric element is utilized to cause droplets of ink to be emitted through an ink nozzle.

A head main body of a typical ink-jet head contains therein a plurality of pressure chambers, to each of which there is fed a supply of ink, and a common ink chamber in communication with the pressure chambers. Formed in a face on the front side of the head main body, i.e., a front face of the head main body, are a plurality of ink nozzles which correspond to the pressure chambers, respectively. On the other hand, provided in a face on the back side of the head main body, i.e., a back face of the head main body, are oscillating plates, each of which constitutes a portion of a compartment wall of each pressure chamber. A common electrode, a piezoelectric element, and an individual electrode are laminated together in sequence on a back side of each oscillating plate. These components (i.e., the oscillating plate, the common electrode, the piezoelectric element, and the individual electrode) together constitute an actuator by which pressure is applied to the pressure chamber, thereby to produce drive force for the emission of droplets of ink through the ink nozzle.

In order to drive the actuator, it is necessary to provide, in addition to the head main body, a driver IC for outputting a drive signal to the actuator. If the driver IC is provided in a printer main body, this results in the requirement that a corresponding number of drive signal lines to the number of ink nozzles are to be extended, by means of FPC or the like, from the printer main body towards the head main body.

In order to achieve a shortening of the drive signal line length, the driver IC is mounted near a lateral face of the head main body (i.e., a face of the head main body perpendicular to a face where ink nozzles are arrayed), in a latest type of ink-jet printer, wherein, from the driver IC disposed in the vicinity of the head main body, a corresponding number of drive signal lines to the number of ink nozzles are extended, by means of FPC or the like, to the head main body. Additionally, the H05-318735's ink-jet head intends to reduce manufacturing costs by cutting the provision of signal lines between the printer main body and the ink-jet head to such an extent that there are provided only signal lines for the driving of IC. To this end, a driver IC 121 is mounted on an oscillating plate 103 of a head main body 100, as shown in FIG. 13. More specifically, the driver IC 121 is mounted side by side with piezoelectric elements 102 and a common electrode 104. FIG. 13 further shows pattern wires 122 for establishing connections between the driver IC 121 and the individual electrodes.

In the foregoing patent gazette, however, the driver IC 121 is mounted directly onto the oscillating plate 103, which results in the requirement that the driver IC 121 is mounted at a distance away from an actuator 101 for avoiding an actually oscillating portion of the oscillating plate 103 (i.e., an area of the oscillating plate 103 where the piezoelectric elements 102 are positioned). Conversely, it is necessary to secure an extra space for the mounting of the driver IC 121 on the back face of the head main body 100. This increases the surface area of the head main body 100, therefore resulting in increasing the overall size of the ink-jet head. Further, even when a certain structure is employed in which the driver IC is positioned in the vicinity of a lateral face of the head main body, it is still necessary to secure a space for the mounting of the driver IC beside the head main body, therefore making it difficult to reduce the overall size of the ink-jet head.

Bearing in mind the above-described problems with the prior art techniques, the present invention was made. Accordingly, a major objet of the invention is to achieve a downsizing of the ink-jet head.

SUMMARY OF THE INVENTION

The present invention achieves the object by employing an arrangement in which a driver IC having a drive circuit is placed on a side, as opposed to the ink emitting direction side where ink nozzles are arranged.

The present invention embodies an ink-jet head. This ink-jet head comprises:

(a) a head main body in which a plurality of nozzles, a plurality of pressure chambers which correspond to the plurality of nozzles, respectively, and a plurality of actuators which correspond to the plurality of nozzles, respectively, are provided, (b) a driver IC in which a drive circuit for outputting a drive signal to each of the plurality of actuators is provided, (c) connecting members for establishing connection between the drive circuit and each of the plurality of actuators so that the drive signal is transmittable therebetween, wherein the plurality of nozzles are arrayed on a first side of the head main body, and wherein the driver IC is mounted on an opposite second side of the head main body.

Since the driver IC is provided on a side of the head main body opposite to the side where the nozzles are arrayed, this eliminates the need for the provision of a space for the placement of the driver IC beside the nozzle array, thereby reducing the overall size of the ink-jet head. Further, with the downsizing of the ink-jet head, it becomes possible to reduce head manufacture costs.

It is preferred that the plurality of actuators are arranged on the second side of the head main body on which the driver IC is mounted.

It is arranged such that the distance between the driver IC and actuator is made shorter, thereby shortening the connecting members used to establish connection between the drive circuit and each actuator.

An arrangement may be made, wherein each of the plurality of actuators includes an input terminal coupled to a corresponding one of the connecting members and a drive portion for producing drive force used to emit ink through a corresponding one of the plurality of nozzles upon receipt of the drive signal, wherein a drive portion group composed of an array of the drive portions of the plurality of actuators is provided on the second side of the head main body on which the driver IC is mounted, and wherein the driver IC is mounted so as to lie astride the drive portion group.

Since the driver IC is mounted so as to lie astride the actuator drive portion group, this secures space used for the operation of the actuator drive portions. As a result, the operation will be carried out smoothly.

An arrangement may be made, wherein the driver IC is, at both ends thereof, fixedly supported on the head main body, and wherein the connecting members are bonding wires for establishing connection between the input terminals of the plurality of actuators and corresponding output terminals of the drive circuit.

It is arranged such that the driver IC is, at the both ends thereof, supported on the head main body. This facilitates the realization of a structure which enables the driver IC to lie astride the actuator drive portion group. Additionally, it is a bonding wire which establishes connection between the input terminal and the output terminal. Accordingly, it is easy to provide connection between the input and output terminals.

An arrangement may be made, wherein the input terminals of the plurality of actuators are arrayed along a first direction in parallel with the driver IC, and wherein a length of the driver IC in a second direction normal to the first direction is set shorter than a length of the actuator drive portion group in the second direction.

As a result of such arrangement, there is created, along the second direction, a clearance between an output terminal of the drive circuit of the driver IC and an input terminal of the actuator of the head main body. This facilitates connecting together the output terminal of the drive circuit of the driver IC and the input terminal of the actuator of the head main body. In addition, wire bonding processes become easy to perform and the state of input terminal to output terminal connection is improved.

An arrangement may be made, wherein the connecting members are bumps for establishing connection between the input terminals of the plurality of actuators and corresponding output terminals of the drive circuit, and wherein the driver IC is arranged face to face with respect to the head main body so that the input terminals and the output terminals are brought into contact with each other via the bumps.

As a result of such arrangement, it becomes easy to provide a structure which enables the driver IC to lie astride the actuator drive portion group, and, in addition, input terminal to output terminal connection can be established easily.

An arrangement may be made, wherein the input terminals of the plurality of actuators are arrayed along a first direction in parallel with the driver IC, and wherein a length of the driver IC in a second direction normal to the first direction is set longer than a length of the actuator drive portion group in the second direction.

As a result of such arrangement, there are provided several advantages. For example, it is possible to set the area of the driver IC greater than that of the head main body. In other words, the driver IC suffers from no constraints imposed by the area of the head main body. This accordingly increases the degree of freedom in design of the driver IC and the head main body.

An arrangement may be made, wherein each of the plurality of actuators is provided with a relay terminal for the relaying of a signal for driving the drive circuit of the driver IC, and wherein the ink-jet head further comprises auxiliary connecting members for establishing connection between each of the relay terminals and the drive circuit so that the signal can be fed to the drive circuit via the relay terminal.

As a result of such arrangement, the signal for driving the drive circuit is transmitted from a signal supply source such as the printer main body, thereafter being delivered to the drive circuit by way of the relay terminal or auxiliary connecting member provided in the actuator. Accordingly, there is no need to provide direct connection between the driver IC and the signal supply source, whereby the facilitation of manufacturing the ink-jet head can be improved and the cutdown of manufacturing costs is promoted. Furthermore, as the auxiliary connecting member, for example, a bonding wire or a bump may suitably be used.

It is preferred that at least the driver IC, the connecting members, and the input terminals of the plurality of actuators are sealed by an encapsulating material which is applied such that a specified clearance is formed between the encapsulating material and the actuator drive portion group.

Since at least the driver IC, the connecting members, and the actuator input terminals are all sealed, thereby preventing these components from capturing dust or the like, and their durability and reliability will be improved. In addition, it is possible to satisfactorily maintain electrical connection between terminals, thereby providing an improved reliability. Further, the actuator drive portion group is sealed, which therefore improves the reliability of the actuators. Since the encapsulating material is applied, with a given clearance formed between itself and the actuator drive portion group, the operation of the actuator drive portions will not be disturbed.

In order to accomplish the foregoing object, in the present invention, it is designed such that the driver IC having the drive circuit is disposed so as to overlap the actuator drive portions of the head main body, with a specified space formed therebetween.

The present invention embodies another ink-jet head. This ink-jet head comprises:

(a) a head main body in which a plurality of nozzles, a plurality of pressure chambers which correspond to the plurality of nozzles, respectively, and a plurality of actuators which correspond to the plurality of nozzles, respectively, are provided, (b) a driver IC in which a drive circuit for outputting a drive signal to each of the plurality of actuators is provided, (c) connecting members for establishing connection between the drive circuit and each of the plurality of actuators so that the drive signal is transmittable therebetween, wherein each of the plurality of actuators includes an input terminal coupled to a corresponding one of the connecting members and a drive portion for producing drive force used to emit ink through a corresponding one of the plurality of nozzles upon receipt of the drive signal, wherein a drive portion group composed of an array of the drive portions of the plurality of actuators is provided on one side of the head main body, and wherein the driver IC is positioned on the outside of the drive portion group of the head main body, lying astride the drive portion group with a specified clearance formed between itself and the drive portion group.

Since the driver IC is provided on the outside of the actuator drive portion group of the head main body, lying astride the actuator drive portion group, there is no need to secure a space for the placement of the driver IC. This reduces the size of the head main body. Further, with the downsizing of the head main body, the cutdown of ink-jet head manufacturing costs can be possible. Owing to the arrangement that the driver IC is positioned at a given distance away from the actuator drive portion group, there is secured space for the operation of the actuator drive portion group. Accordingly, the operation will not be disturbed.

An arrangement may be made, wherein the driver IC is, at both ends thereof, fixedly supported on the head main body, and wherein the connecting members are bonding wires for establishing connection between the input terminals of the plurality of actuators and corresponding output terminals of the drive circuit.

The driver IC is, at the both ends thereof, supported on the head main body. As a result of such arrangement, the driver IC can easily be positioned on the outside of the actuator drive portion group, with a specified clearance formed between itself and the drive portion group. Further, input terminal to output terminal connection is established by means of a bonding wire, which facilitates connection between the input terminal and the output terminal.

An arrangement may be made, wherein the input terminals of the plurality of actuators are arrayed along a first direction in parallel with the driver IC, and wherein a length of the driver IC in a second direction normal to the first direction is set shorter than a length of the actuator drive portion group in the second direction.

As a result of such arrangement, there is created, along the second direction, a clearance between an output terminal of the drive circuit of the driver IC and an actuator input terminal of the head main body. This facilitates connecting together the output terminal of the drive circuit of the driver IC and the input terminal of the actuator of the head main body. In addition, wire bonding processes become easy to perform and the state of input terminal to output terminal connection is improved.

An arrangement may be made, wherein the connecting members are bumps for establishing connection between the input terminals of the plurality of actuators and corresponding output terminals of the drive circuit, and wherein the driver IC is arranged face to face with respect to the head main body so that the input terminals and the output terminals are brought into contact with each other via the bumps.

As a result of such arrangement, the driver IC can easily be located on the outside of the actuator drive portion group, with a given clearance formed between itself and the actuator drive portion group, and input terminal to output terminal connection can be established easily.

An arrangement may be made, wherein the input terminals of the plurality of actuators are arrayed along a first direction in parallel with the driver IC, and wherein a length of the driver IC in a second direction normal to the first direction is set longer than a length of the actuator drive portion group in the second direction.

Since the driver IC is disposed so as to overlap the head main body, with a given clearance formed between itself and the head main body, it is possible to determine the size of the driver IC without suffering from any constraints imposed by the area of the head main body. Accordingly, it is possible to increase the degree of freedom in design of the driver IC and the head main body.

It is preferred that at least the driver IC, the connecting members, and the input terminals of the plurality of actuators are sealed by an encapsulating material which is applied such that a specified clearance is formed between the encapsulating material and the actuator drive portion group.

Since the driver IC, the connecting members, and the actuator input terminals are all sealed, this prevents these components from capturing dust or the like, thereby improving their environmental resistance and reliability. Further, it becomes possible to satisfactorily maintain inter-terminal electrical connection, thereby providing improvement in reliability. Furthermore, the actuator drive portion group is sealed, thereby improving the reliability of the actuators. Since the encapsulating material is applied, with a given clearance formed between itself and the actuator drive portion group, the operation of the actuator drive portions will not be disturbed.

The present embodiment embodies a method of manufacturing an ink-jet head which includes (a) a head main body in which a plurality of nozzles, a plurality of pressure chambers which correspond to the plurality of nozzles, respectively, and a plurality of actuators which correspond to the plurality of nozzles, respectively, are provided, and (b) a driver IC in which a drive circuit for outputting a drive signal to each of the plurality of actuators is provided. More specifically, the ink-jet head manufacturing method includes:

(i) a step of temporarily affixing an adhesive to locations situated at both sides of a drive portion group composed of an array of a plurality of drive portions of the plurality of actuators in the head main body, (ii) a step of placing the driver IC onto the adhesives so that the driver IC lies astride the drive portion group, (iii) a step of wire bonding together, by means of bonding wires, output terminals of the drive circuit of the driver IC and corresponding input terminals of the plurality of actuators of the head main body.

As described above, an adhesive is temporarily affixed to locations situated at both sides of a drive portion group composed of an array of a plurality of drive portions of the actuators in the head main body. Then, the driver IC is placed onto the adhesive-carrying locations and hardening is carried out, whereby the driver IC will be, at the both ends thereof, firmly supported on the head main body in an easy manner. Further, the output and input terminals are wire bonded, thereby easily establishing inter-terminal connections.

An arrangement may be made, wherein the foregoing ink-jet head manufacturing method further includes, after the wire bonding step, a step of applying an encapsulating material in the form of a film which is greater in size than the driver IC onto the driver IC, the bonding wires, and the input terminals, and melting the encapsulating material in such a way as to prevent the encapsulating material from extending around to the sides of the drive portion group, whereby the driver IC, the bonding wires, and the input terminals will be sealed.

The encapsulating material in the form of a film is applied onto the driver IC, the bonding wires, and the input terminals of the head main body. Then, the applied encapsulating material is melted such that it will not extend around to the sides of the actuator drive portion group. Accordingly, the driver IC, the bonding wires, and the input terminals are sealed, without disturbing the operation of each of the drive portions of the actuators.

The present invention embodies another method of manufacturing an ink-jet head which includes (a) a head main body in which a plurality of nozzles, a plurality of pressure chambers which correspond to the plurality of nozzles, respectively, and a plurality of actuators which correspond to the plurality of nozzles, respectively, are provided, and (b) a driver IC in which a drive circuit for outputting a drive signal to each of the plurality of actuators is provided. More specifically, the ink-jet head manufacturing method includes:

(i) a step of forming bumps on at least either output terminals of the drive circuit of the driver IC or input terminals of the plurality of actuators of the head main body, (ii) a step of placing the head main body and the driver IC face to face with respect to each other so that the input terminals and the output terminals are brought into contact with each other via the bumps, and joining together the head main body and the driver IC so that drive portions of the plurality of actuators of the head main body are not brought into contact with the driver IC.

Owing to such arrangement, the input and output terminals are brought into contact with each other through the bumps. On the other hand, the driver IC and the head main body are jointed together face to face in order not to bring the actuator drive portions into contact with the driver IC. Accordingly, the driver IC is disposed easily in an overlapping manner with the head main body. Output terminal to input terminal connection can be established easily, and, at the same time, operation space for each actuator drive portion is secured.

An arrangement may be made, wherein the aforesaid ink-jet head manufacturing method further includes, after the step of joining together the head main body and the driver IC, a step of applying an encapsulating material in the form of a film which is greater in size than the driver IC, onto the driver IC and the input terminals of the plurality of actuators, and melting the encapsulating material so that the encapsulating material will not extend around to the sides of the actuator drive portions, for sealing the driver IC, the bumps, and the input terminals.

The encapsulating material in the form of a film is applied onto the driver IC and the head main body. Then, the applied encapsulating material is melted such that it will not extend around to the sides of the actuator drive portions. Accordingly, the driver IC, the bumps, and the input terminals are sealed, without disturbing the operation of each of the actuator drive portions.

DESCRIPTION OF THE PREFERRED EMBODIMENTS

Reference is now made to the drawings for the description of preferred embodiments of the present invention.

First Embodiment

Figure 1:
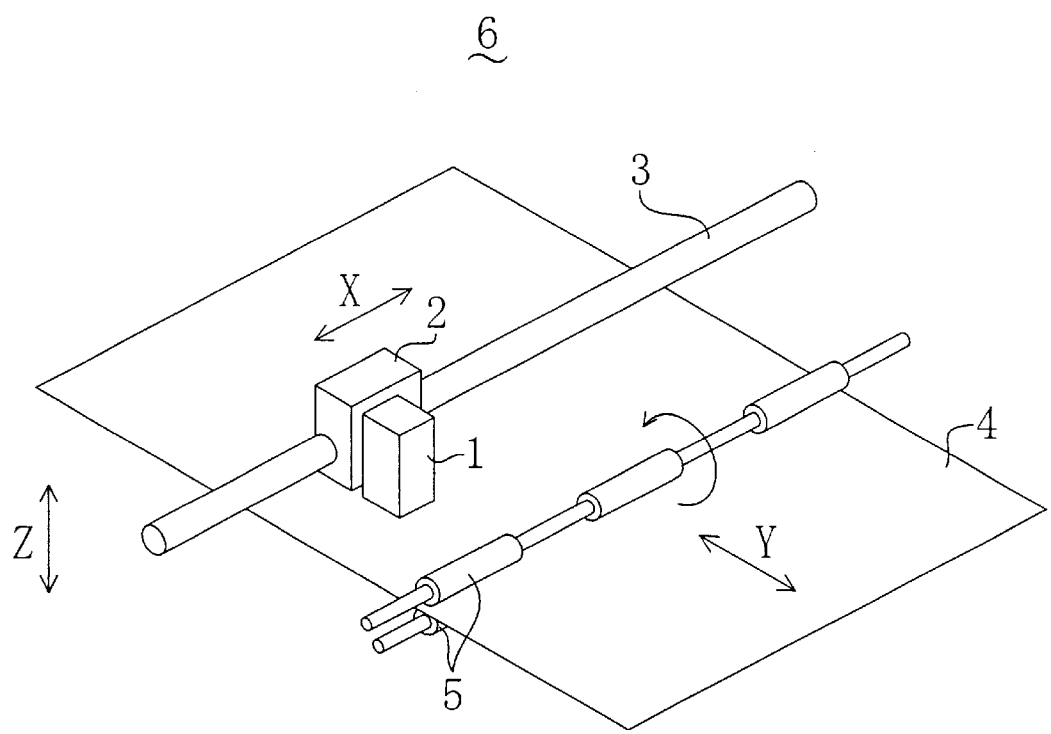
FIG. 1 is a perspective view showing major constituent components of an ink-jet printer.

As shown in FIG. 1, an ink-jet printer 6 has an ink-jet head 1 capable of recording by making utilization of the piezoelectric effect of piezoelectric elements. Droplets of ink emitted from the ink-jet head 1 are landed on a recording medium 4 such as a sheet of copy paper, so that recording can be performed on the recording medium 4. The ink-jet head 1 is mounted on a carriage 2 capable of reciprocating movement along a carriage shaft 3. More specifically, the ink-jet head 1 is structured such that it can reciprocate in a primary scanning direction X in parallel with the carriage shaft 3. The recording medium 4 is timely conveyed by a roller 5 in a secondary scanning direction Y.

Figure 2:
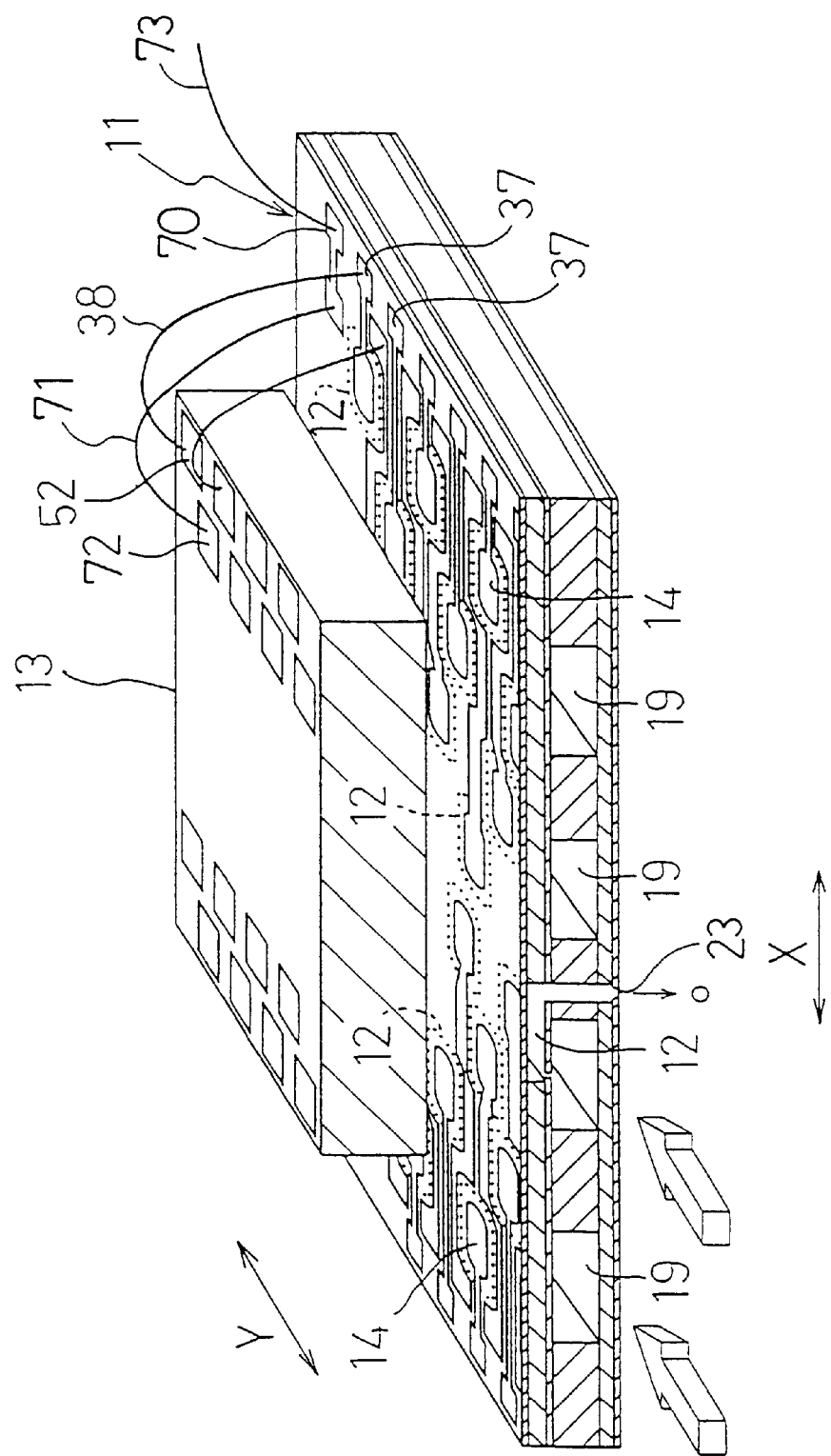
FIG. 2 is a perspective view showing a part of the ink-jet head.

As shown in FIG. 2, the ink-jet head 1 comprises a head main body (substrate) 11 and a driver IC (substrate) 13. In the head main body 11, a great number of ink nozzles 23 and a great number of pressure chambers 12 are formed for emitting droplets of ink. In the driver IC 13, a drive circuit, not shown in the figure, is arranged for applying a drive signal to an actuator 14 of each of the pressure chambers 12. Hereinafter, a structure of the head main body 11 is first described in a concrete manner, and, then, a manner of the mounting of the driver IC 13 will be described.

Structure of the Head Main Body

As shown in FIG. 2, in the present embodiment, eight pressure chambers 12 are arranged along a primary scanning direction X, forming eight pressure chamber rows along a secondary scanning direction Y.

Figure 3:
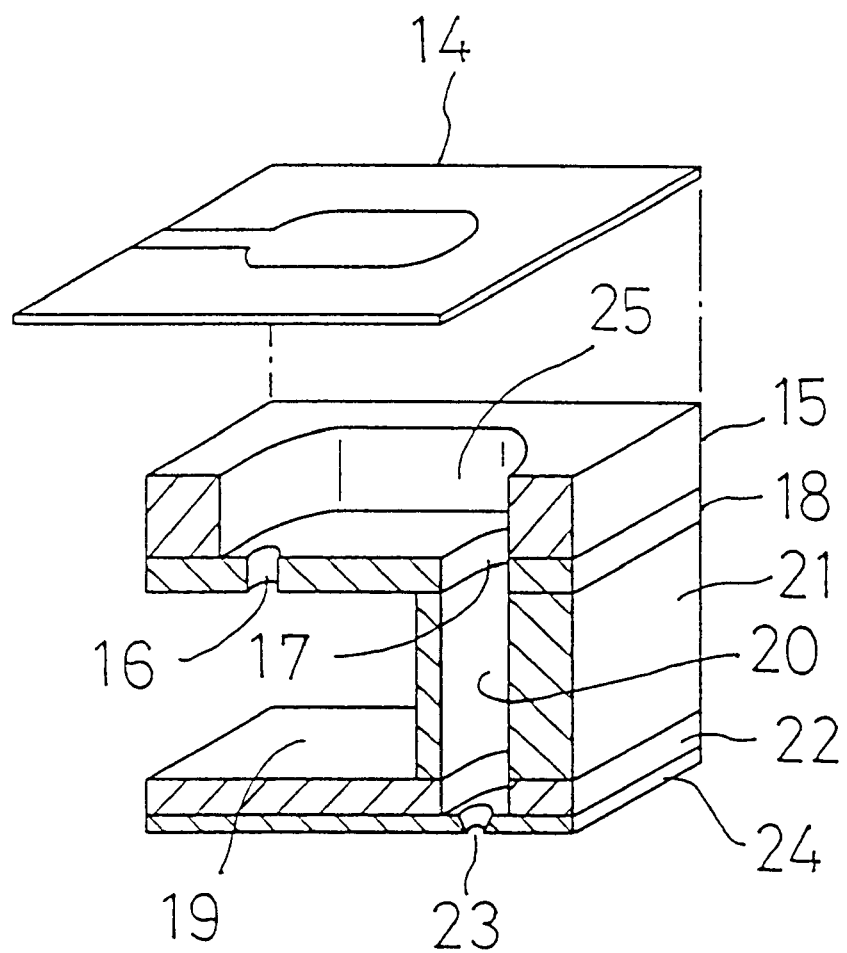
FIG. 3 is an exploded perspective view showing a part of the head main body, as well as a part of the actuator.

Referring to FIG. 3, the head main body 11 is formed by vertically overlapping together five different plates, namely, a first plate 15 having a through hole for the formation of a pressure chamber, a second plate 18 having an ink supplying port 16 and an ink emitting port 17, third and fourth plates 21 and 22 for the formation of an ink supplying passage 19 and an ink emitting passage 20, and a fifth plate (nozzle plate) 24 having an ink emitting aperture 23. In other words, the first and second plates 15 and 18 together form a pressure-chamber concave recess portion 25 having at its bottom surface the ink supplying port 16 and the ink emitting port 17. The second to fourth plates 18, 21, and 22 together form the ink supplying passage 19 in communication with the ink supplying port 16 and the ink emitting passage 20 in communication with the ink emitting port 17. The ink emitting passage 20 is in communication with the nozzle (ink emitting aperture) 23 of the fifth plate 24. An actuator 14 is placed on the first plate 15 in such a manner as to close an opening end of the concave recess portion 25, thereby to form a pressure chamber 12.

Figure 4:
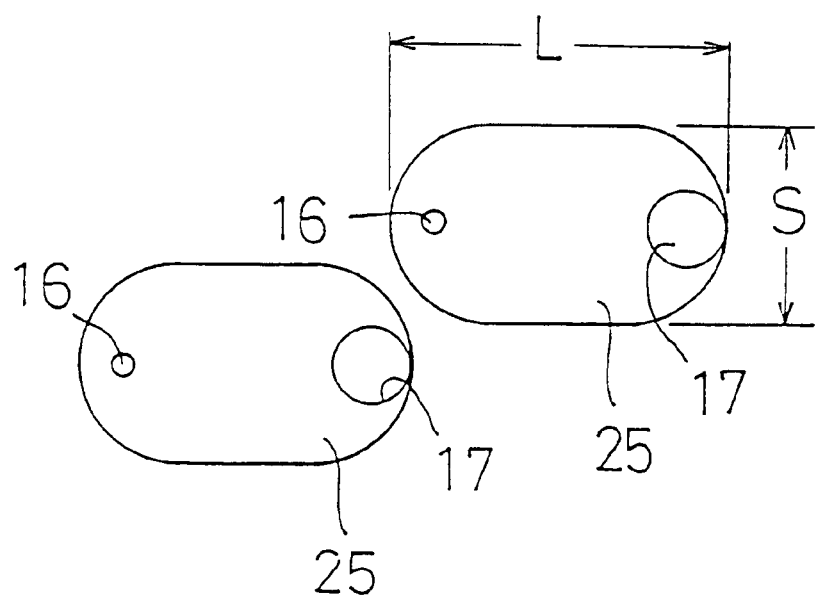
FIG. 4 is a top view showing the opening shape of a concave recess portion for a pressure chamber of the head main body (which is also the shape of a movable portion of the actuator or the shape of a movable portion of the oscillating plate).

Referring now to FIG. 4, there is shown a concrete example of the opening end shape of the concave recess portion 25. More specifically, the concave recess portion 25 has an opening end shape of an ellipse with an L/S ratio of from 1 to 3 where L is the major (longer) axis and S is the minor (shorter) axis. The concave recess portion 25 is formed such that the major axis L runs parallel with the primary scanning direction X.

Figure 5:
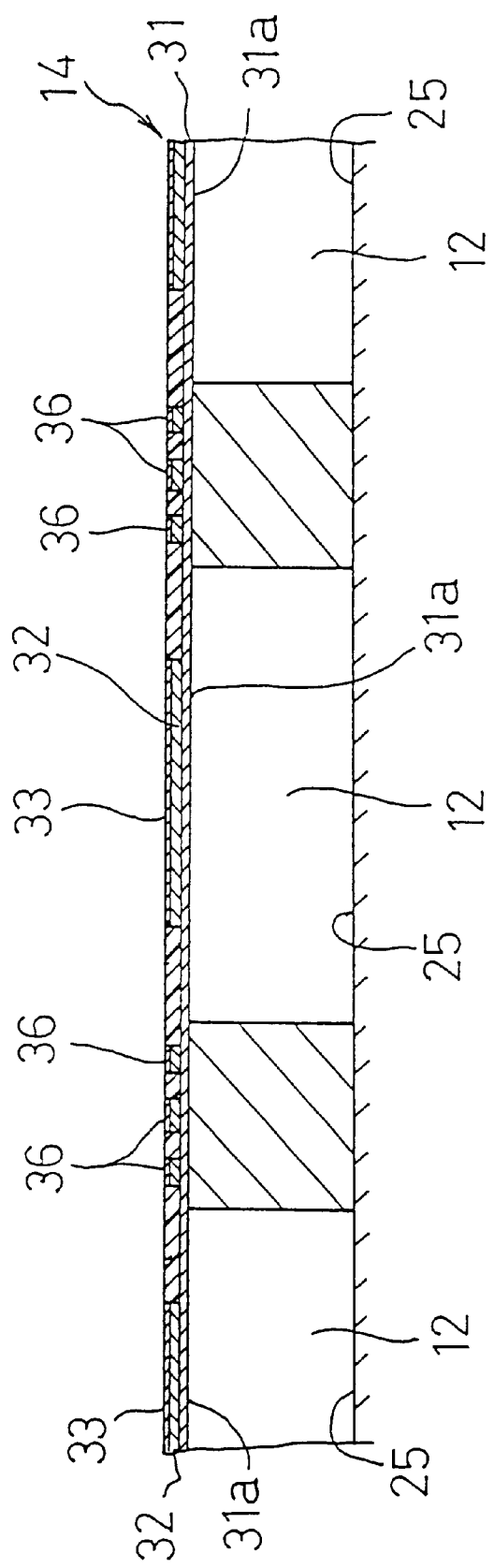
FIG. 5 is a cross-sectional view taken along the line Z—Z of FIG. 6 of the head main body.

As shown in FIG. 5, the actuator 14 is composed of a thin-film oscillating plate 31, which is formed so as to cover a great number of the concave recess portions 25, a thin-film piezoelectric element 32, and a thin-film individual electrode 33, the element 32 and the electrode 33 being jointed together in an overlapping fashion on a movable portion 31a of the oscillating plate 31 forming the pressure chamber 12. The oscillating plate 31 comprises either Cr or a material of the Cr family having a thickness of from 1 $\mu$m to 5 $\mu$m. The oscillating plate 31 functions also as a common electrode for the emission of ink for all the pressure chambers 12. On the other hand, the piezoelectric element 32 and the individual electrode 33 are provided to each pressure chamber 12. The piezoelectric element 32 comprises PZT, having a thickness of from 1 $\mu$m to 7 $\mu$m. The individual electrode 33 comprises Pt or a material of the Pt family, having a thickness of 1 $\mu$m or less, for example, 0.1 $\mu$m.

Figure 6:
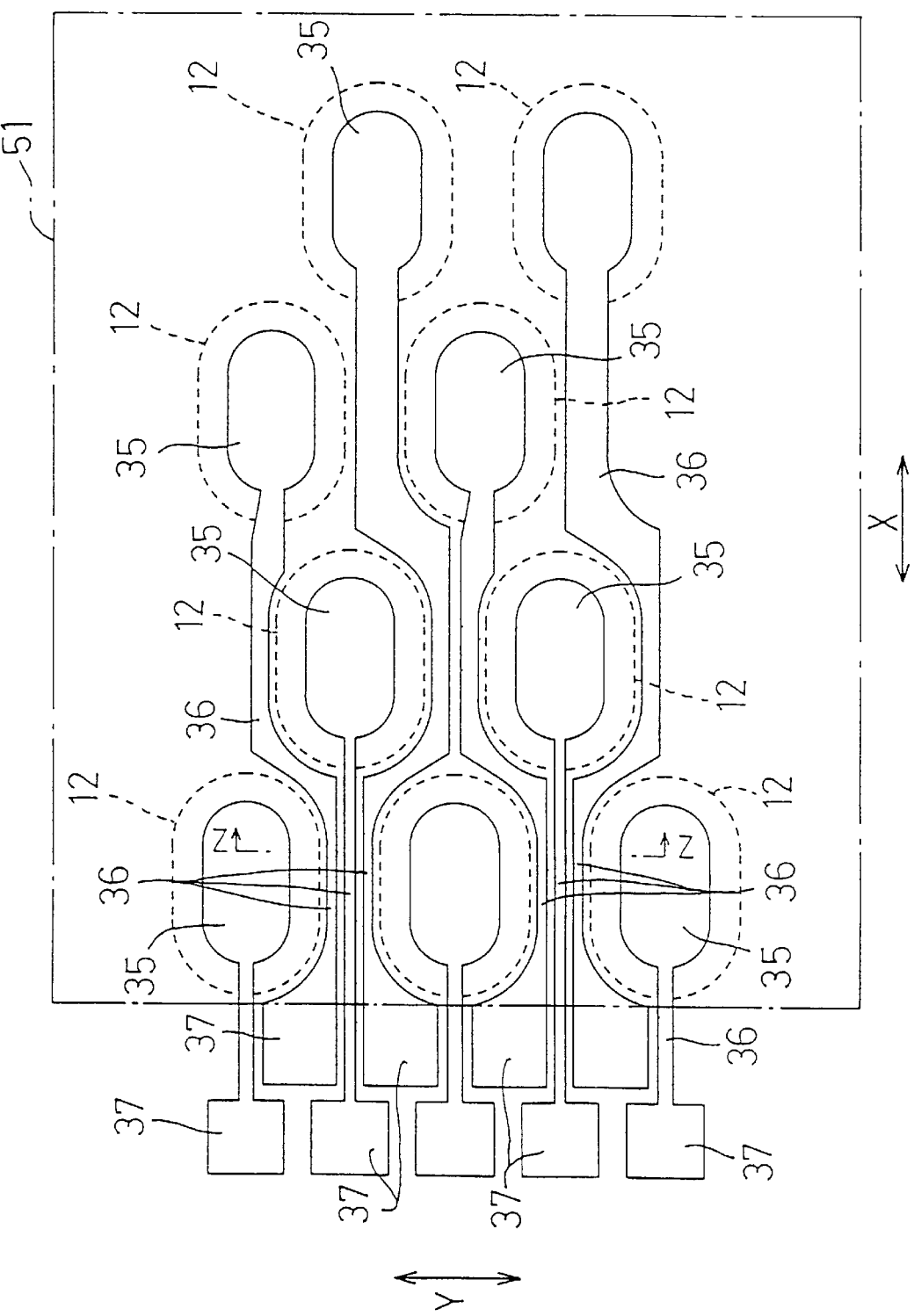
FIG. 6 is a top view of the head main body showing an array of actuator main body portions, as well as an array of input terminals.

Referring now to FIG. 6, there is shown a concrete example of the layout of the pressure chambers 12 and other components of the ink-jet head 1. The actuator 14 has a drive portion group 51 composed of an array of a plurality of drive portions 35, the description of which will be made later, and an input terminal 37.

FIG. 6 is an illustration showing, of the eight pressure chamber rows, only four of them on the left-hand side of FIG. 2, and each of these pressure chambers 12 is formed such that its major axis L is at right angles with respect to the row direction. Additionally, FIG. 6 shows that, with respect to a group of pressure chambers 12 in the first row on the leftmost side, each of pressure chambers 12 in the second row is positioned at the location corresponding to an area defined between adjoining ones of the pressure chambers 12 in the first row. The relationship between the pressure chamber layout of the second row and that of the third row, and the relationship between the pressure chamber layout of the third row and that of the fourth row are the same as the relationship between the pressure chamber layout of the first row and that of the second row. In other words, a large number of the pressure chambers 12 are arranged in a plurality of rows, forming a zigzag pattern so that pressure chambers of adjoining rows are shifted in position from each other. The pressure chambers 12 of the respective rows are not arranged in the same straight line normal to the direction in which each row extends, being gradually shifted in position from each other in the row direction. As a result of such arrangement, dot positions are shifted away from each other in the secondary scanning direction Y. Like the four rows on the left-hand side, the remaining four rows on the right-hand side, shown in FIG. 2, are likewise arranged to form a zigzag pattern.

The piezoelectric element 32 and the individual electrode 33, provided in each of the pressure chambers 12, together form, on the surface of the oscillating plate 31, the same pattern as the one formed by the piezoelectric element 32 and the individual electrode 33 provided in any other of the pressure chambers 12. The aforesaid drive portion 35 is formed on the movable portion 31a of the oscillating plate 31, so that the movable portion 31a will be deformed by the drive portion 35. Further, the piezoelectric element 32 and the individual electrode 33 form a conductor portion 36 extending outwardly of the leftmost pressure chamber row from the drive portion 35, and they further form an input terminal 37 on the outside of the leftmost pressure chamber row. The oscillating plate 31, which is a common electrode, and the individual electrode 33 are insulated from each other by the piezoelectric element 32.

The conductor portion 36, which extends from the drive portion 35 of the pressure chamber 12 of each pressure chamber row located interior to the leftmost pressure chamber row, passes between two adjoining pressure chambers 12 of a different pressure chamber row or between pressure chambers 12 of two adjoining pressure chamber rows. In other words, in the ink-jet head 1 of the present embodiment, a great number of the pressure chambers 12 are arranged in a plurality of rows, forming the pressure chambers of adjoining pressure chamber rows into a zigzag pattern. Accordingly, the pressure chambers 12 are arranged to a maximum density, and a head surface side portion of the partition wall separating two adjoining pressure chambers is utilized as a space for the placement of the conductor portion 36. Since the three pressure chamber rows are arranged on the inside of the leftmost pressure chamber row, the three conductor portions 33 pass between adjoining pressure chambers 12 of the leftmost pressure chamber row, as shown in FIG. 5.

Such a pattern formed by the piezoelectric element 32 and the individual electrode 33 is the same for the four pressure chamber rows on the right-hand side. In these four right-hand side pressure chamber rows, the conductor portions 36 extend outwardly of the rightmost pressure chamber row, and a group of electric contacts is formed on the outside of the rightmost pressure chamber row.

In the way described above, the drive portions 35 are arranged in a zigzag pattern, thereby to form the drive portion group 51 on the back side of the head main body 11, and the input terminals 37 of the actuators 14 are arranged along a direction normal to the primary scanning direction X (the second direction) in both lateral sides of the drive portion group 51, i.e., in the secondary scanning direction Y (the first direction).

Referring to FIG. 2, there are provided, on the back side of the head main body 11, a plurality of relay terminals 70 (for example, five relay terminals 70). The relay terminal 70 acts as a terminal for the relaying of a signal transmitted from the printer main body (not shown in the figure) and used to drive the drive circuit. One of ends of the relay terminal 70 is coupled to the printer main body via a wire 73 and the other end thereof is coupled to an input terminal 72 of the driver IC 13 via a bonding wire 71, which is not shown in FIG. 7.

Mounting Manner of the Driver IC

Figure 7:
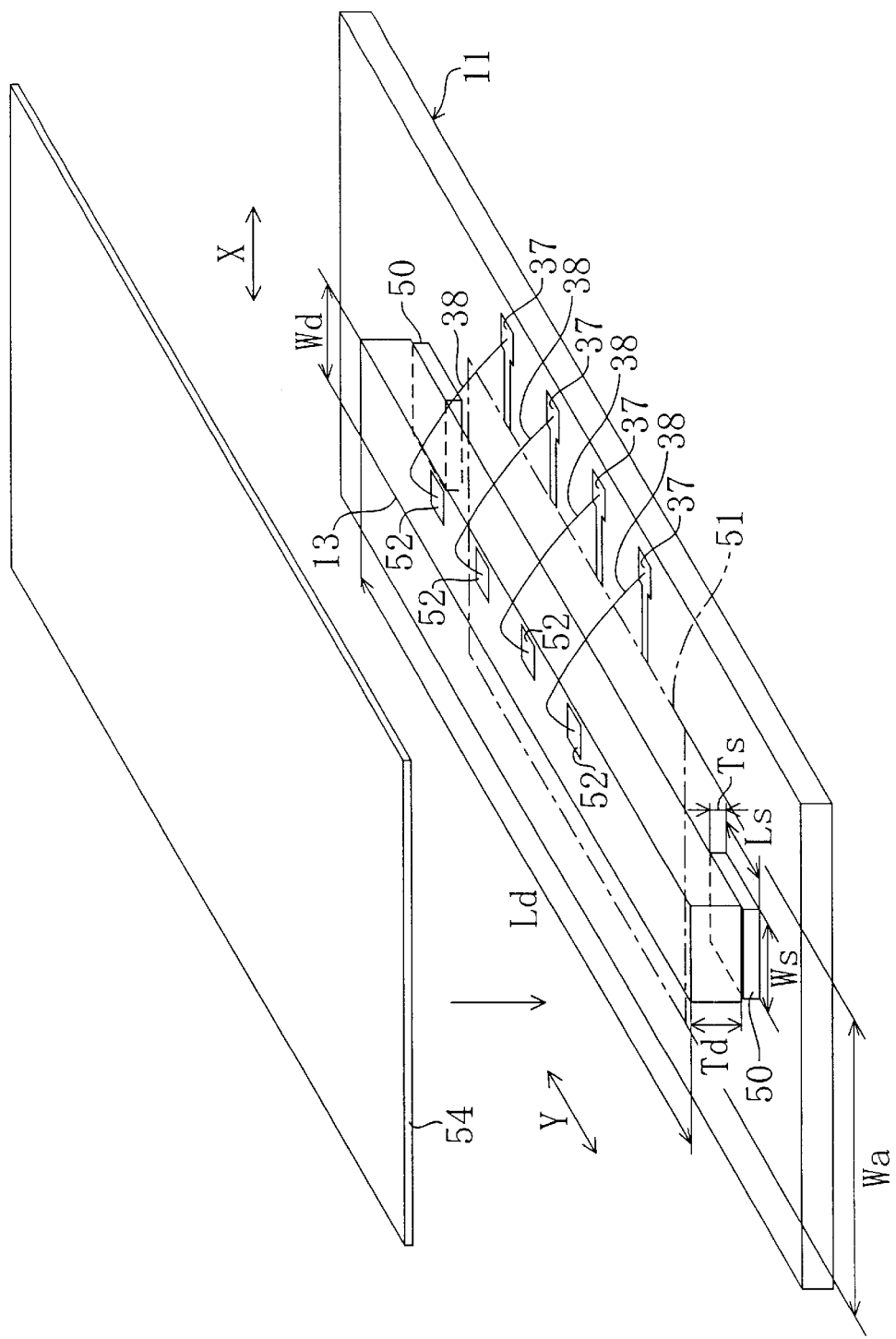
FIG. 7 is a schematic perspective view showing a mounting manner of the driver IC with respect to the head main body.

As schematically shown in FIG. 7, in the present embodiment, the driver IC 13 extends in the secondary scanning direction Y and both of the ends thereof are firmly secured to the head main body 11 through respective spacers 50. In other words, the driver IC 13 is die-bonded at both of its ends in the secondary scanning direction Y. More specifically, the driver IC 13 is, at both of its ends, firmly supported on the head main body 11. The spacers 50 are placed on both ends of the head main body 11 in the secondary scanning direction Y. In other words, these two spacers 50 are located such that they face each other across the drive portion group 51 in the secondary scanning direction Y.

Each of the spacers 50 comprises a film-like adhesive, e.g., epoxy resin, in the form of a rectangular plate. It is preferable for the spacer 50 to have a longer longitudinal length Ls (which is the length extending along the secondary scanning direction Y and hereinafter is referred to as the spacer length) from the point of view of the requirement that the driver IC 13 be firmly fastened to the head main body 11. On the contrary, from the point of view of the requirement that the head be reduced in size, it is preferable for the spacer 50 to have a shorter spacer length Ls. Here, taking into account the condition of transmission of supersonic waves and heat when performing wire bonding processes, the spacer length Ls is set to values ranging from 0.5 mm up to 2 mm. The lateral length of the spacer 50 (which is the length extending along the primary scanning direction X and is hereinafter referred to as the space width), Ws, is, for example, from 0.5 mm to 2 mm. The vertical length of the spacer 50 (which is the length extending along a height direction normal to both the primary scanning direction X and the secondary scanning direction Y, and is hereinafter referred to as the spacer height), Ts, is, for example, from 50 µm to 1000 µm, more preferably from 50 µm to 300 µm.

The driver IC 13 is, at its ends, fixedly supported on the upper surfaces of both the spacers 50. The longitudinal length of the driver IC 13 (which is the length extending along the secondary scanning length Y and hereinafter is referred to as the driver length), Ld, is set greater than the drive portion group 51 of the head main body 11, as well as than the distance between the two spacers 50. However, if the driver length Ld is set too long, the driver IC 13 is likely to oscillate when performing supersonic wave bonding processes for establishing the connection by application of supersonic wave vibration. This might result in a reduction in bonding connection strength because supersonic waves are absorbed by the oscillation of the driver IC 13. For this reason, it is preferred that the driver length Ld is set somewhat longer than the drive portion group 51 (for example, 1 mm or less). The lateral length of the driver IC 13 (which is the length extending along the primary scanning length X and hereinafter is referred to as the driver width), Wd, is almost as long as the spacer width Ws. The driver width Wd is set shorter than the drive portion group 51 for facilitating wire bonding processes between the output terminals 52 of the driver IC 13 and the input terminals 37 of the head main body 11.

To sum up, the driver IC 13 is disposed astride the drive portion group 51 of the head main body 11, lying on the outside of the drive portion group 51 of the head main body 11, with a given spacing kept with respect to the drive portion group 51. This spacing is determined such that the driver IC 13 and the drive portion group 51 are not brought into contact with each other by the drive operation of each drive portion 35 of the drive portion group 51 and by the deflection deformation of the driver IC 13.

For example, in order to prevent the driver IC 13 from being brought into contact with the drive portion group 51 by deflection deformation caused by a force applied at the time of wire bonding processes, both the driver length Ld and the spacer height Ts are set such that the space between the driver IC 13 and the drive portion group 51 exceeds the maximum displacement of deflection deformation of the driver IC 13. More specifically, the spacer height Ts is set such that $Ts > (W \cdot Ld^3)/(4 \cdot E \cdot Wd \cdot Td^3)$, where E indicates the longitudinal elastic coefficient of the driver IC 13, W indicates the force that is applied to the driver IC 13 at the time of wire bonding, and Td indicates the driver height. The output terminals 52 of the driver IC 13 and the input terminals 37 are connected together by bonding wires 38. For example, as the bonding wire 38, a wire of Au or a wire of a material of the Au family having a diameter of about 20 µm may be used preferably. As a wire freedom degree L as a bonding length (which is the horizontal distance between bonding points) decreases, the overall size of the head likewise decreases, thereby reducing the cost of the head. However, in the present embodiment, the capillary angle (i.e., the angle of a capillary leading end) of a wire bonding device, θ, is set to around 30 degrees, so that the wire freedom degree L is set to around 0.5 mm.

The driver IC 13, the bonding wires 38 and 71, and the input terminals 37 and the relay terminals 70 of the head main body 11 are all coated with an encapsulating material 54 of a resin such as epoxy. On the other hand, the drive portion group 51 is sealed by the encapsulating material 54, with a given clearance kept with respect to the driver IC 13. In other words, the encapsulating material 54 is provided such that there exists a given clearance between itself and the drive portion group 51. FIG. 7 shows a state before the driver IC 13, the input terminals 37, and other components are coated with the encapsulating material 54.

Mounting Technique of the Driver IC

A way of mounting the driver IC 13, which is a part of the manufacturing method of the ink-jet head 1, will be described below.

In the first place, the input terminals 37 of the actuators 14 of the head main body 11, the relay terminals 70, and the output and input terminals 52 and 72 of the driver IC 13 are all plated by gold (Au). Other suitable plating materials include aluminum (Al) and copper (Cu).

Thereafter, films of adhesive (i.e., joining material) used to form the spacers 50 are placed on given positions of the head main body 11, i.e., where the driver IC 13 is supported at its both ends. A predetermined amount of heat is applied to the adhesive films for temporal hardening. In other words, the adhesive films are temporarily affixed to the head main body 11.

Subsequently, the driver IC 13 is placed, across the drive portion group 51, onto the adhesive films. This is followed by application of predetermined pressure and heat thereby to subject the adhesive films to complete hardening, whereby the driver IC 13 is die-bonded at each end thereof.

The input terminal 37 of the head main body 11 and the output terminal 52 of the driver IC 13, both of which are gold-plated, are connected together by the bonding wire 38. Further, the relay terminal 70 and the input terminal 72 of the driver IC 13 are connected together by the bonding wire 71. That is to say, there are carried out wire bonding processes.

The encapsulating material 54 in the form of a film of epoxy resin, which is greater than the driver IC 13, is placed onto the driver IC 13. Then, the encapsulating material 54 is subjected to melting and hardening under a predetermined condition (temperature profile). As a result, the driver IC 13, the bonding wires 38 and 71, the input terminals 37, and the other components are sealed with the encapsulating material 54, and, at the same time, the drive portion group 51 is sealed with a given clearance formed between itself and the driver IC 13, at which time the characteristic of the encapsulating material 54 and the foregoing condition are determined so as to prevent a part of the encapsulating material 54 from extending around to the sides of the drive portion group 51.

As described above, according to the first embodiment of the invention, the driver IC 13 is disposed at a position overlapping with the head main body 11 on a side opposite to the ink emitting direction (nozzle arrangement surface) side. As a result of such arrangement, the area of a surface formed by the primary and secondary scanning directions X and Y of the ink-jet head 1 is small. Accordingly, the ink-jet head 1 can be downsized and can be manufactured inexpensively.

In the first embodiment of the invention, the driver IC 13 and the other components are sealed with the encapsulating material 54. However, the provision of the encapsulating material 54 is not necessarily required. It is possible to omit the use of the encapsulating material 54 and therefore the step of encapsulating.

Second Embodiment

Like the ink-jet head 1 of the first embodiment, an ink-jet head of a second embodiment of the invention includes a head main body 11 and a driver IC 13. The head main body 11 of the present embodiment is identical in structure with that of the first embodiment, and its description will be omitted.

Figure 8:
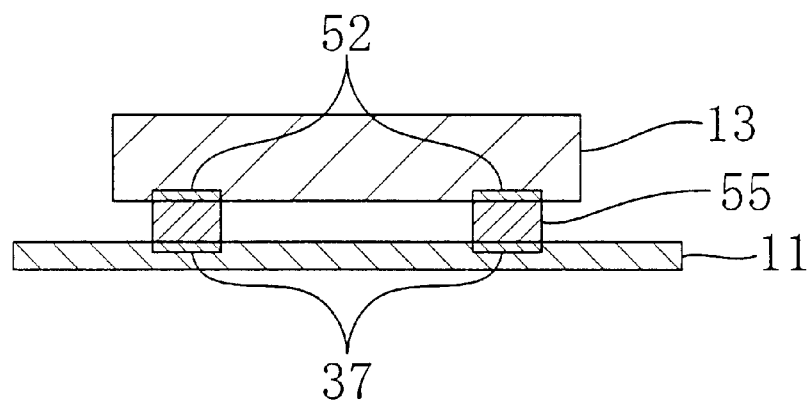
FIG. 8 is a schematic cross-sectional view showing another mounting manner of the driver IC with respect to the head main body.

As shown in FIG. 8, in the second embodiment, the driver IC 13 is jointed to the head main body 11 using a so-called flip chip technique (which is also called a face down bonding technique). In other words, connection between the output terminal 52 of the driver IC 13 and the input terminal 37 of the head main body 11, and connection between the input terminal 72 of the driver IC 13 and the relay terminal 70 of the head main body 11 are each established through a bump 55. The bump 55 is formed of, preferably, solder or gold (Au). Although not shown in the figure, the encapsulating material 54 lies on an upper portion of the driver IC 13 as well as on a portion of the head main body 11, as in the first embodiment.

Firstly, a mounting technique employing the bump 55 of solder will be described. As a first step, the input terminal 37 of the actuator 14 of the head main body 11 and the relay terminal 70 are solder-plated. The solder bump 55 is formed on each of the output and input terminals 52 and 72 of the driver IC 13.

Next, the head main body 11 and the driver IC 13 are arranged face to face with each other. This is followed by application of heat to melt the solder bumps 55, so that contact of the input terminal 37 with the output terminal 52, and contact of the relay terminal 70 with the input terminal 72 are made. As a result, connection between the input terminal 37 and the output terminal 52, and connection between the relay terminal 70 and the input terminal 72 are established through the respective bumps 55.

As a subsequent step, the encapsulating material 54 in the form of a film, which is one size greater than the driver IC 13 and comprises epoxy resin, is placed on the driver IC 13. Thereafter, heat is applied on the basis of a predetermined condition such that a part of the encapsulating material 54 will not extend around to the sides of the drive portion group 51. The encapsulating material 54 is melted and then hardened. As a result, the driver IC 13, the bumps 55, the input terminals 72 of the head main body 11, and other components are sealed by the encapsulating material 54, and, at the same time, the drive portion group 51 is sealed.

VARIATION EXAMPLES

In addition to the foregoing mounting technique of the driver IC 13, there are some other mounting techniques which will be described below.

Technique Using UV-Setting Insulating Resin

Figure 9:
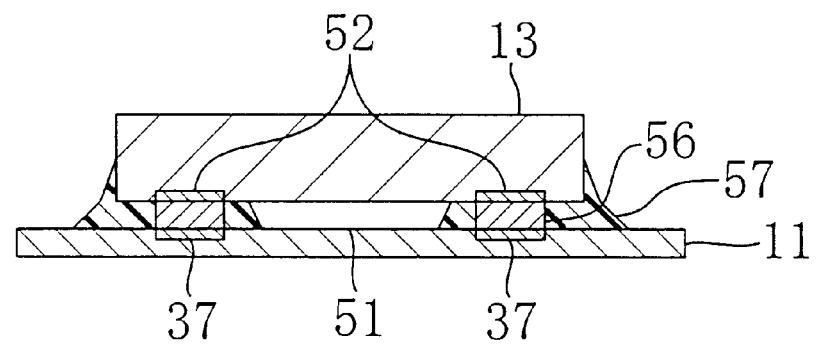
FIG. 9 is a schematic cross-sectional view showing still another mounting manner of the driver IC with respect to the head main body.

As shown in FIG. 9, in this mounting technique, gold-plated bumps 56 are first formed on the output and input terminals 52 and 72 of the driver IC 13, and, then, a UV-setting insulating resin 57 is applied around the input and relay terminals 37 and 70 of the head main body 11. As a subsequent step, the driver IC 13 is disposed in a face to face fashion with respect to the head main body 11, so that contact between the output terminal 52 and the input terminal 37, and contact between the input terminal 72 and the relay terminal 70 are established. Under the condition that a part of the UV-setting insulating resin 57 will not extend around to the sides of the drive portion group 51, the UV-setting insulating resin 57 is set by ultraviolet radiation, with a constant pressure being applied. As a result, by virtue of shrinkage stress produced when the UV-setting insulating resin 57 undergoes setting, the output terminal 52 of the driver IC 13 and the input terminal 37 of the head main body 11 are connected together by pressure, and the input terminal 72 and the relay terminal 70 are connected together by pressure, whereby desirable electrical connections can be obtained. In a subsequent step, the encapsulating material 54 in the form of a film is placed from above the driver IC 13 and the same encapsulating processes as described above are performed.

Technique Using Conductive Resin

Figure 10:
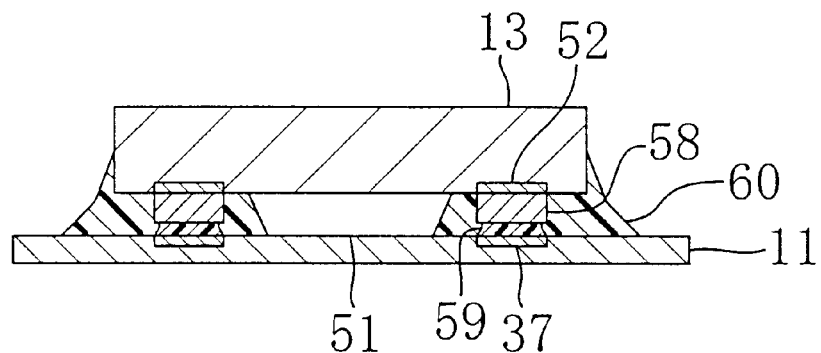
FIG. 10 is a schematic cross-sectional view showing a further mounting manner of the driver IC with respect to the head main body.

As shown in FIG. 10, in the present technique, gold wire bumps 58 are first formed on the output and input terminals 52 an 72, and, then, a conductive resin 59 is transferred onto the input and relay terminals 37 and 70 of the head main body 11. In a subsequent step, the driver IC 13 and the head main body 11 are aligned with each other so that, through the conductive resin 59, the output and input terminals 52 and 37 are brought into contact with each other and the input terminal and relay terminals 72 and 70 are brought into contact with each other. This is followed by application of pressure and heat, to harden the conductive resin 59. Thereafter, a thermo-setting insulating resin 60 is applied around the output terminal 52, the relay terminal 70, and the input terminals 37 and 72. The thermo-setting insulating resin 60 is then set. As a result, the driver IC 13 and the head main body 11 are jointed together and desirable electric connection is established between the terminals 37 and 52 and between the terminals 70 and 72. Thereafter, as in the above, encapsulating processes are carried out with the encapsulating material 54.

Technique Using Anisotropic Conductive Material

Figure 11:
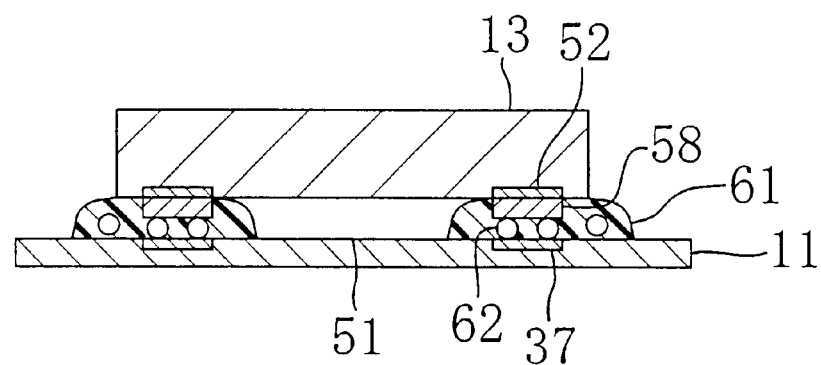
FIG. 11 is a schematic cross-sectional view showing another mounting manner of the driver IC with respect to the head main body.

Techniques, such as ACF (anisotropic conductive film technique) and ACP (anisotropic conductive paste technique), are available. For instance, as shown in FIG. 11, gold wire bumps 58 are first formed on the output and input terminals 52 and 72 of the driver IC 13, and, then an insulating binder resin 61, which contains therein metal particles 62 formed of, for example, gold (Au), is applied around the output terminal 52, the input terminal 72, or the input terminal 37. Subsequently, the driver IC 13 and the head main body 11 are disposed face to face with each other so that the output and input terminals 52 and 37 are vertically overlapped with each other and the input terminal 72 and the relay terminal 70 are vertically overlapped with each other. Then, while the driver IC 13 and the head main body 11 are pressed against each other, heat is applied to harden the binder resin 61. As a result, the driver IC 13 and the head main body 11 are jointed together, and, at the same time, through the metal particle 62, desirable electrical connection is established between the output terminal 52 and the input terminal 37, and between the relay terminal 70 and the input terminal 72. Thereafter, as in the above, encapsulating processes are carried out with the encapsulating material 54.

Note that, in any one of the foregoing mounting techniques, the provision of the encapsulating material 54 is not necessarily required. It is possible to omit the use of the encapsulating material 54 and therefore the step of encapsulating.

Third Embodiment

The driver IC 13 is disposed astride the drive portion group 51 of the head main body 11, which makes it possible to determine, in a free manner, the size of the driver IC 13 under no constraints imposed by the head main body 11.

Figure 12:
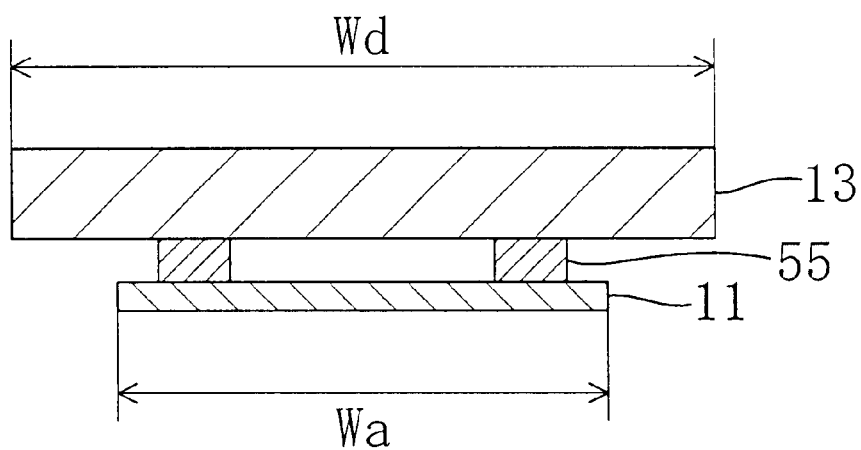
FIG. 12 is a schematic cross-sectional view showing still another mounting manner of the driver IC with respect to the head main body.
Figure 13:
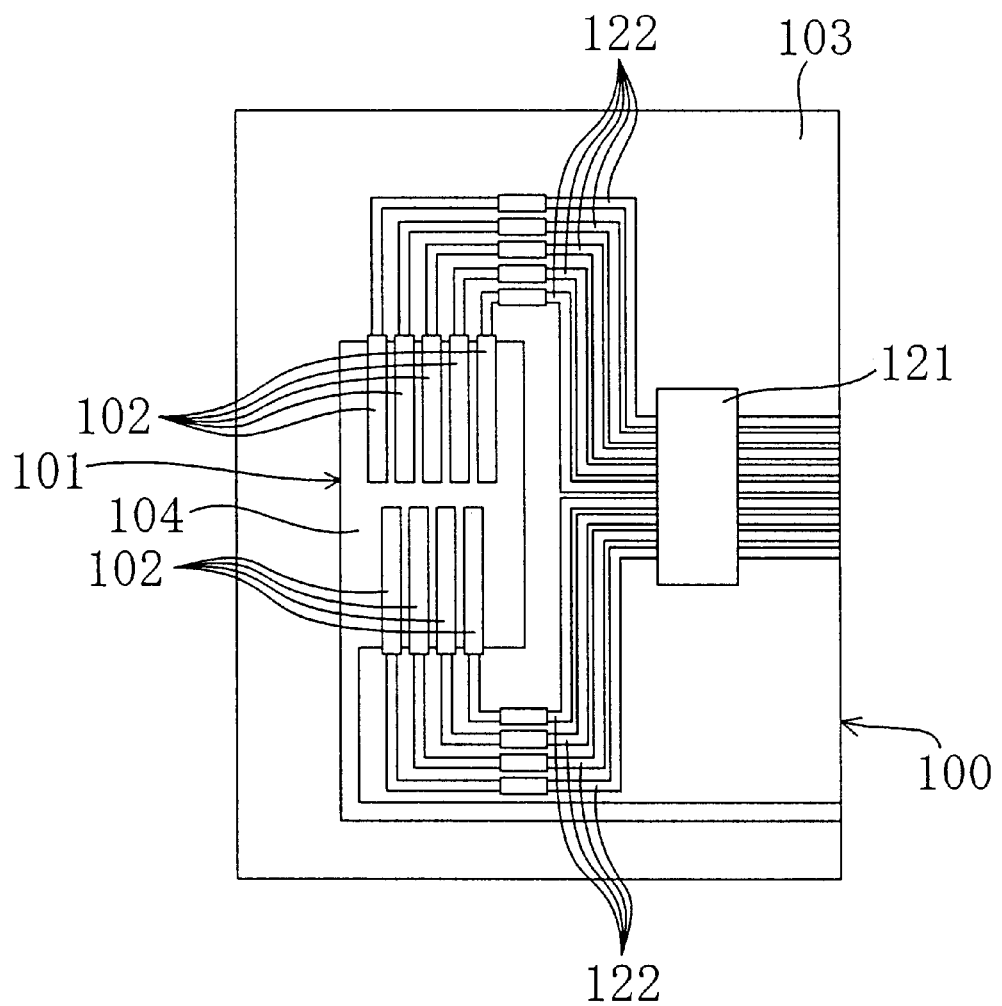
FIG. 13 is a top view showing a manner of the mounting of a driver IC in a commonly-used ink-jet head.

Therefore, as shown in FIG. 12, in a third embodiment of the invention, the length extending in the primary scanning direction X (the second direction), i.e., the driver width Wd, is set longer than the length Wa extending in the direction X of the drive portion group 51 of the head main body 11. In the present embodiment, the driver IC 13 is mounted in the same manner as in the second embodiment. An arrangement may be made, in which the driver width Wd is set longer than the length of the head main body 11 extending in the primary scanning direction X.

The third embodiment accordingly increases the degree of freedom in design of the driver IC 13 and the head main body 11.

It will be appreciated by those of ordinary skill in the art that the invention is not limited to any one of the foregoing first to third embodiments and can be embodied in other specific forms without departing from the spirit or essential character thereof.

The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. An ink-jet head comprising:

(a) a head main body in which a plurality of nozzles, a plurality of pressure chambers which correspond to said plurality of nozzles, respectively, and a plurality of actuators which correspond to said plurality of nozzles, respectively, are provided, (b) a driver IC in which a drive circuit for outputting a drive signal to each of said plurality of actuators is provided, (c) connecting members for establishing connection between said drive circuit and each of said plurality of actuators so that said drive signal is transmittable therebetween, wherein said plurality of nozzles are arrayed on a first side of said head main body, wherein said driver IC is mounted on an opposite second side of said head main body, wherein said plurality of actuators are arranged on said second side of said head main body on which said driver IC is mounted, wherein each of said plurality of actuators includes an input terminal coupled to a corresponding one of said connecting members and a drive portion for producing drive force used to emit ink through a corresponding one of said plurality of nozzles upon receipt of said drive signal, wherein a drive portion group composed of an array of said drive portions of said plurality of actuators is provided on said second side of said head main body on which said driver IC is mounted, wherein said driver IC is mounted so as to lie astride said drive portion group, wherein each of said plurality of actuators is provided with a relay terminal for the relaying of a signal for driving said drive circuit of said driver IC, and wherein said ink-jet head further comprises auxiliary connecting members for establishing connection between each of said relay terminals and said, drive circuit so that said signal can be fed to said drive circuit via said relay terminal.

2. An ink-jet head comprising:

(a) a head main body in which a plurality of nozzles, a plurality of pressure chambers which correspond to said plurality of nozzles, respectively, and a plurality of actuators which correspond to said plurality of nozzles, respectively, are provided, (b) a driver IC in which a drive circuit for outputting a drive signal to each of said plurality of actuators is provided, (c) connecting members for establishing connection between said drive circuit and each of said plurality of actuators so that said drive signal is transmittable therebetween, wherein said plurality of nozzles are arrayed on a first side of said head main body, wherein said driver IC is mounted on an opposite second side of said head main body, wherein said plurality of actuators are arranged on said second side of said head main body on which said driver IC is mounted, wherein each of said plurality of actuators includes an input terminal coupled to a corresponding one of said connecting members and a drive portion for producing drive force used to emit ink through a corresponding one of said plurality of nozzles upon receipt of said drive signal, wherein a drive portion group composed of an array of said drive portions of said plurality of actuators is provided on said second side of said head main body on which said driver IC is mounted, wherein said driver IC is mounted so as to lie astride said drive portion group; and wherein at least said driver IC, said connecting members, and said input terminals of said plurality of actuators are sealed by an encapsulating material which is applied such that a specified clearance is formed between said encapsulating material and said actuator drive portion group.

3. An ink-jet head comprising:

(a) a head main body in which a plurality of nozzles, a plurality of pressure chambers which correspond to said plurality of nozzles, respectively, and a plurality of actuators which correspond to said plurality of nozzles, respectively, are provided, (b) a driver IC in which a drive circuit for outputting a drive signal to each of said plurality of actuators is provided, (c) connecting members for establishing connection between said drive circuit and each of said plurality of actuators so that said drive signal is transmittable therebetween, wherein each of said plurality of actuators includes an input terminal coupled to a corresponding one of said connecting members add a drive portion for producing drive force used to emit ink through a corresponding one of said plurality of nozzles upon receipt of said drive signal, wherein a drive portion group composed of an array of said drive portions of said plurality of actuators is provided on one side of said head main body, wherein said driver IC is positioned on the outside of said drive portion group of said head main body, lying astride said drive portion group with a specified clearance formed between itself and said drive portion group, and wherein at least said driver IC, said, connecting members, and said input terminals of said plurality of actuators are sealed by an encapsulating material which is applied such that a specified clearance is formed between said encapsulating material and said actuator drive portion group.

4. A method of manufacturing an ink-jet head which includes (a) a head main body in which a plurality of nozzles, a plurality of pressure chambers which correspond to said plurality of nozzles, respectively, and a plurality of actuators which correspond to said plurality of nozzles, respectively, are provided, and (b) a driver IC in which a drive circuit for outputting a drive signal to each of said plurality of actuators is provided, said ink-jet head manufacturing method including:
(i) a step of temporarily affixing an adhesive to locations situated at both sides of a drive portion group composed of an array of a plurality of drive portions of said plurality of actuators in said head main body,
(ii) a step of placing said driver IC onto said adhesives so that said driver IC lies astride said drive portion group,
(iii) a step of wire bonding together, by means of bonding wires, output terminals of said drive circuit of said driver IC and corresponding input terminals of said plurality of actuators of said head main body.

5. The ink-jet head manufacturing method according to claim 4 further including, after said wire bonding step, a step of applying an encapsulating material in the form of a film which is greater in size than said driver IC, onto said driver IC, said bonding wires, and said input terminals, and melting said encapsulating material in such a way as to prevent said encapsulating material from extending around to the sides of said drive portion group, whereby said driver IC, said bonding wires, and said input terminals will be sealed.

6. A method of manufacturing an ink-jet head which includes (a) a head main body in which a plurality of nozzles, a plurality of pressure chambers which correspond to said plurality of nozzles, respectively, and a plurality of actuators which correspond to said plurality of nozzles, respectively, are provided, and (b) a driver IC in which a drive circuit for outputting a drive signal to each of said plurality of actuators is provided, said ink-jet head manufacturing method including:
(i) a step of forming bumps on at least either output terminals of said drive circuit of said driver IC or input terminals of said plurality of actuators of said head main body,
(ii) a step of placing said head main body and said driver IC face to face with respect to each other so that said input terminals and said output terminals are brought into contact with each other via said bumps, and joining together said head main body and said driver IC so that drive portions of said plurality of actuators of said head main body are not brought into contact with said driver IC.

7. The ink-jet head manufacturing method according to claim 6 further including, after said step of joining together said head main body and said driver IC, a step of applying an encapsulating material in the form of a film which is greater in size than said driver IC, onto said driver IC and said input terminals of said plurality of actuators, and melting said encapsulating material so that said encapsulating material will not extend around to the sides of said actuator drive portions, for sealing said driver IC, said bumps, and said input terminals.

8. An ink-jet head comprising:
(a) a head main body in which a plurality of nozzles, a plurality of pressure chambers which correspond to said plurality of nozzles, respectively, and a plurality of actuators which correspond to said plurality of nozzles, respectively, are provided,
(b) a driver IC in which a drive circuit for outputting a drive signal to each of said plurality of actuators is provided,
(c) connecting members for establishing connection between said drive circuit and each of said plurality of actuators so that said drive signal is transmittable therebetween, wherein said plurality of nozzles are arrayed on a first side of said head main body, wherein said driver IC is mounted on an opposite second side of said head main body, wherein said plurality of actuators are arranged on said second side of said head main body on which said driver IC is mounted, wherein each of said plurality of actuators includes an input terminal coupled to a corresponding one of said connecting members and a drive portion for producing drive force used to emit ink through a corresponding one of said plurality of nozzles upon receipt of said drive signal, wherein a drive portion group composed of an array of said drive portions of said plurality of actuators is provided on said second side of said head main body on which said driver IC is mounted, wherein said driver IC is mounted so as to lie astride said drive portion group, wherein said driver IC is, at both ends thereof, fixedly supported on said head main body, wherein said connecting members are bonding wires for establishing connection between said input terminals of said plurality of actuators and corresponding output terminals of said drive circuit, wherein the both ends of said driver IC are supported on said head main body through spacers, and each of said spacer height Ts is set such that $$Ts > (W \cdot Ld^3)/(4 \cdot E \cdot Wd \cdot Td^3),$$

Where W indicates a force that is applied to the driver IC at the time of wire bonding, Ld indicates a length of the driver, E indicates the longitudinal elastic coefficient of the driver IC, Wd indicates a width of the driver, and Td indicates a height of the driver IC.

9. An ink-jet head comprising:
(a) a head main body in which a plurality of nozzles, a plurality of pressure chambers which correspond to said plurality of nozzles, respectively, and a plurality of actuators which correspond to said plurality of nozzles, respectively, are provided,
(b) a driver IC in which a drive circuit for outputting a drive signal to each of said plurality of actuators is provided,
(c) connecting members for establishing connection between said drive circuit and each of said plurality of actuators so that said drive signal is transmittable therebetween, wherein each of said plurality of actuators includes an input terminal coupled to a corresponding one of said connecting members and a drive portion for producing drive force used to emit ink through a corresponding one of said plurality of nozzles upon receipt of said drive signal, wherein a drive portion group composed of an array of said drive portions of said plurality of actuators is provided on one side of said head main body, wherein said driver IC is positioned on the outside of said drive portion group of said head main body, lying astride said drive portion group with a specified clearance formed between itself and said drive portion, group, wherein said driver IC is, at both ends thereof, fixedly supported on said head main body, wherein said connecting members are bonding wires for establishing connection between said input terminals of said plurality of actuators and corresponding output terminals of said drive circuit, wherein the both ends of said driver IC are supported on said head main body through spacers, and each of said spacer height Ts is set such that $$Ts > (W \cdot Ld^3)/(4 \cdot E \cdot Wd \cdot Td^3),$$

Where W indicates a force that is applied to the driver IC at the time of wire bonding, Ld indicates a length of the driver, E indicates the longitudinal elastic coefficient of the driver IC, Wd indicates a width of the driver, and Td indicates a height of the driver IC.

* * * * *